United States Patent
Reill et al.

(10) Patent No.: US 8,306,084 B2
(45) Date of Patent: Nov. 6, 2012

(54) LASER LIGHT SOURCE

(75) Inventors: Wolfgang Reill, Pentling (DE); Soenke Tautz, Tegernheim (DE); Peter Brick, Regensburg (DE); Uwe Strauss, Bad Abbach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 118 days.

(21) Appl. No.: 12/809,849

(22) PCT Filed: Dec. 16, 2008

(86) PCT No.: PCT/DE2008/002123
§ 371 (c)(1), (2), (4) Date: Sep. 15, 2010

(87) PCT Pub. No.: WO2009/080011
PCT Pub. Date: Jul. 2, 2009

(65) Prior Publication Data
US 2011/0051766 A1  Mar. 3, 2011

(30) Foreign Application Priority Data

Dec. 21, 2007 (DE) .......... 10 2007 061 922
Mar. 12, 2008 (DE) .......... 10 2008 013 896

(51) Int. Cl.
*H01S 5/00* (2006.01)

(52) U.S. Cl. .................. 372/45.01; 372/50.12

(58) Field of Classification Search ............. 372/45.01, 372/50.12
See application file for complete search history.

(56) References Cited

U.S. PATENT DOCUMENTS

| 5,392,308 | A |   | 2/1995 | Welch et al. |
| 5,412,678 | A | * | 5/1995 | Treat et al. ............ 372/45.01 |
| 5,555,544 | A |   | 9/1996 | Walpole et al. |
| 6,014,396 | A |   | 1/2000 | Osinski et al. |
| 6,249,536 | B1 |   | 6/2001 | Farries et al. |
| 6,744,800 | B1 | * | 6/2004 | Kneissl et al. ........... 372/50.1 |
| 2006/0133443 | A1 | * | 6/2006 | Chua et al. ............ 372/50.121 |
| 2008/0112450 | A1 | * | 5/2008 | Krakowski ........... 372/45.01 |

FOREIGN PATENT DOCUMENTS

| DE | 197 17 571 | 10/1998 |
| DE | 103 16 220 | 11/2004 |
| EP | 0 624 284 | 1/1993 |
| FR | 2 879 840 | 6/2006 |

* cited by examiner

*Primary Examiner* — Kinam Park
(74) *Attorney, Agent, or Firm* — Cozen O'Connor

(57) ABSTRACT

A laser light source comprises, in particular, a semiconductor layer sequence (10) having an active layer having at least two active regions (45) which are suitable for emitting electromagnetic radiation during operation via a side area of the semiconductor layer sequence (10) along an emission direction (90), said side area being embodied as a radiation coupling-out area (12), a respective electrical contact area (30) above each of the at least two active regions (45) on a main surface (14) of the semiconductor layer sequence (10), and a surface structure in the main surface (14) of the semiconductor layer sequence (10), wherein the at least two active regions (45) are arranged in a manner spaced apart from one another in the active layer (40) transversely with respect to the emission direction (90), each of the electrical contact areas (30) has a first partial region (31) and a second partial region (32) having a width that increases along the emission direction (90) toward the radiation coupling-out area (12), the surface structure has, between the at least two electrical contact areas (30), at least one first depression (6) along the emission direction (90) and also second depressions (7), and the first partial regions (31) of the electrical contact areas (30) are in each case arranged between at least two second depressions (7).

15 Claims, 7 Drawing Sheets

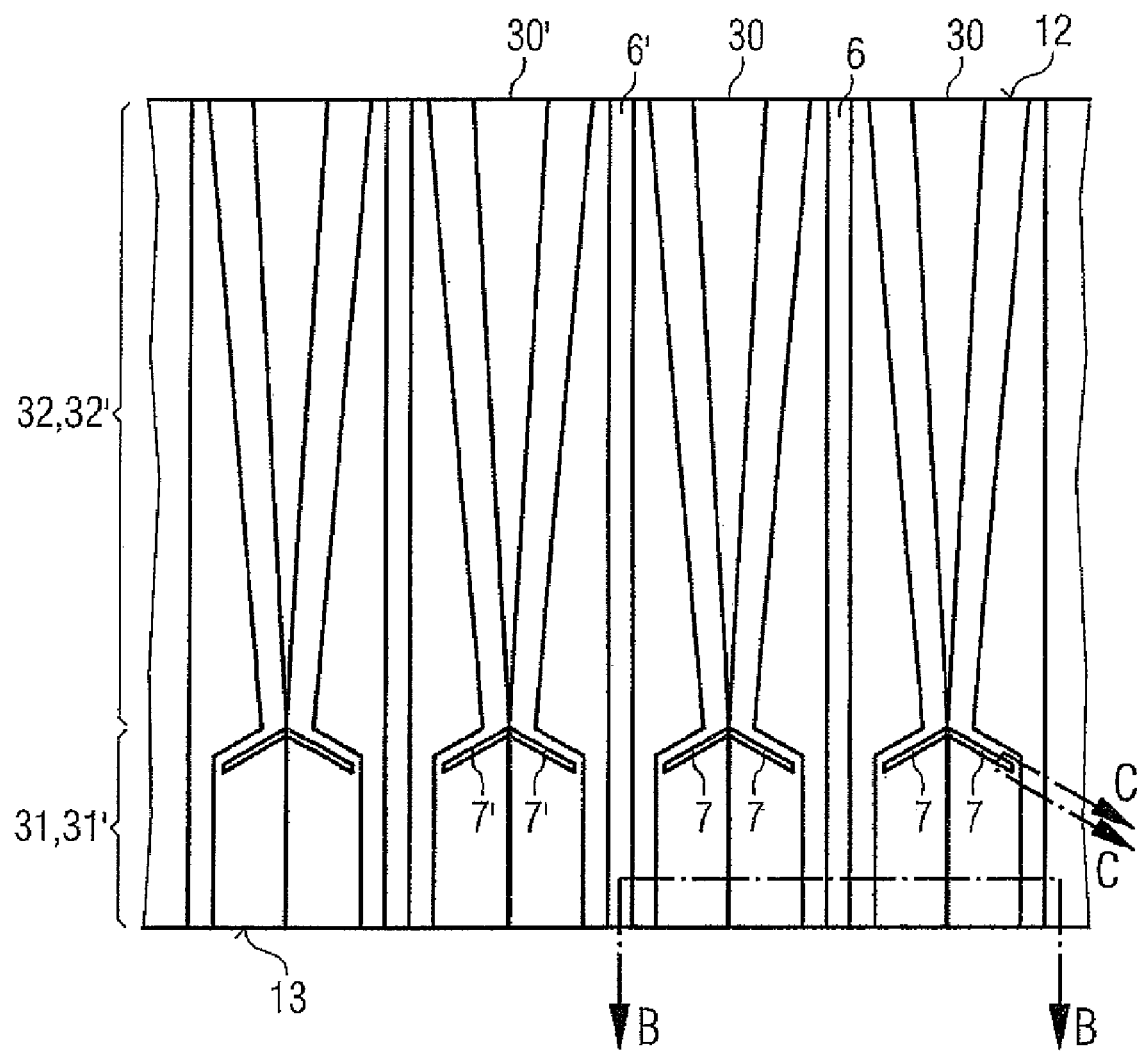

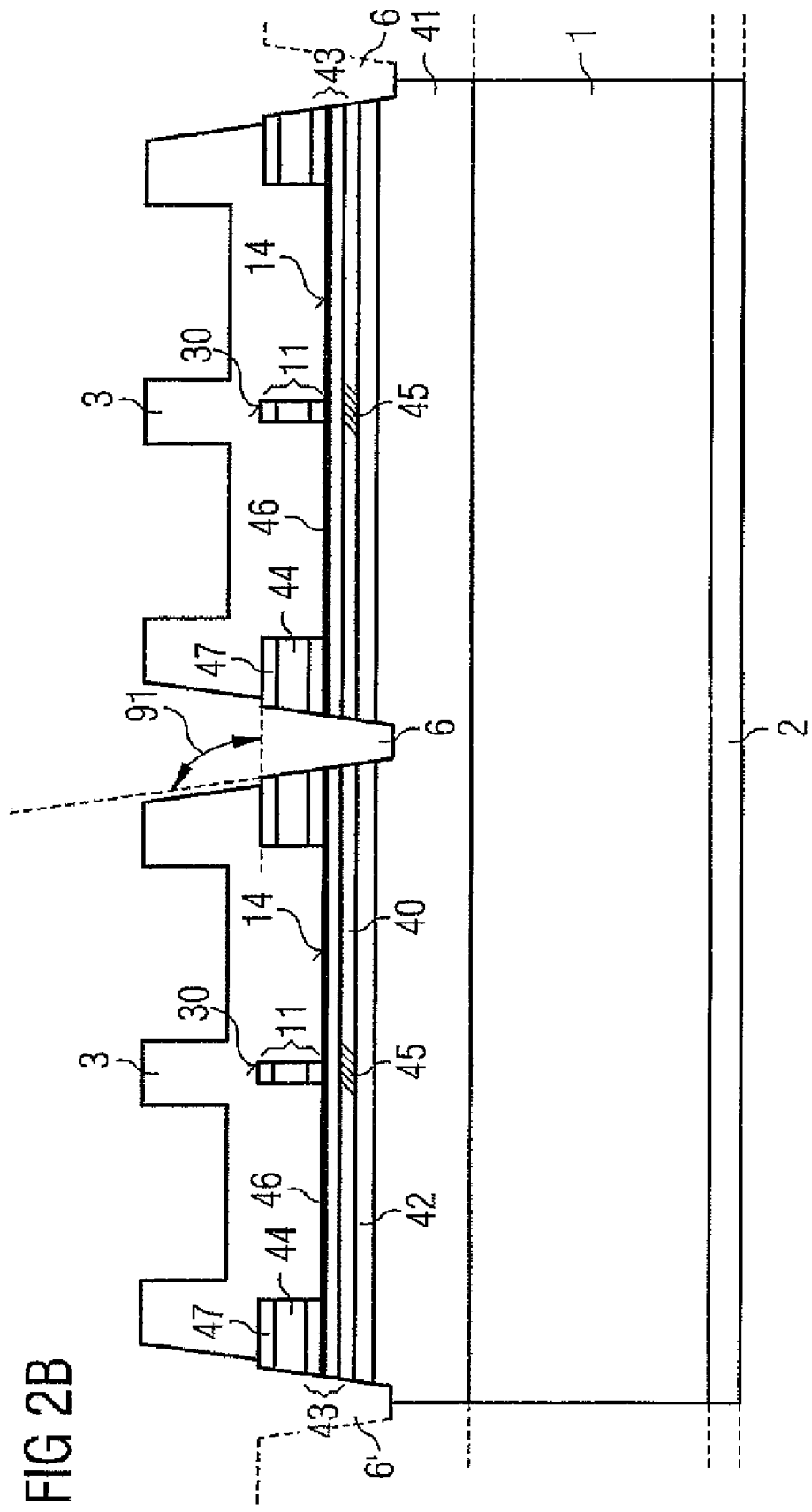

LASER LIGHT SOURCE

RELATED APPLICATIONS

This is a U.S. national stage of application No. PCT/DE2008/002123, filed on Dec. 16, 2008.

This patent application claims the priorities of German Patent Application 10 2007 061 922.9 filed Dec. 21, 2007 and of German Patent Application 10 2008 013 896.7 filed Mar. 12, 2008, the disclosure contents of both of which are hereby incorporated by reference.

FIELD OF THE INVENTION

The present invention is related to a laser light source comprising a semiconductor layer sequence.

BACKGROUND OF THE INVENTION

Laser systems for optical applications, for instance projection applications, and also for laser pump sources for coupling into optical fibers require a high brilliance, that is to say a high power and a high beam quality. The latter is given by the so-called beam parameter product, that is to say the product of the beam waist radius and the divergence angle of the light emitted by the laser. Furthermore, for material processing applications and for pump lasers for solid-state lasers, for instance, it may be desirable to use lasers having a high power in conjunction with a small emission area.

SUMMARY OF THE INVENTION

One object of at least one embodiment is to provide a laser light source comprising a semiconductor layer sequence having at least two active regions.

In accordance with at least one embodiment, a laser light source comprises, in particular,

- a semiconductor layer sequence having an active layer having at least two active regions which are suitable for emitting electromagnetic radiation during operation via a side area of the semiconductor layer sequence along an emission direction, said side area being embodied as a radiation coupling-out area,
- a respective electrical contact area above each of the at least two active regions on a main surface of the semiconductor layer sequence, and
- a surface structure in the main surface of the semiconductor layer sequence, wherein
- the at least two active regions are arranged in a manner spaced apart from one another in the active layer transversely with respect to the emission direction,
- each of the electrical contact areas has a first partial region and a second partial region having a width that increases along the emission direction toward the radiation coupling-out area,
- the surface structure has, between the at least two electrical contact areas, at least one first depression along the emission direction and also second depressions, and
- the first partial regions of the electrical contact areas are in each case arranged between at least two second depressions.

Here and hereinafter "transversely" can mean that a first direction embodied transversely with respect to a second direction has at least one direction component which is perpendicular to the second direction. In particular, that can mean that the first direction is perpendicular to the second direction.

Here and hereinafter "light" or "electromagnetic radiation" can equally mean, in particular, electromagnetic radiation having at least one wavelength or a wavelength range from an infrared to ultraviolet wavelength range. In particular, the light or the electromagnetic radiation can encompass a visible, that is to say a red to blue, wavelength range having one or more wavelengths of between approximately 450 nm and approximately 700 nm. In this case, the semiconductor layer sequence can generate coherent electromagnetic radiation brought about by stimulated emission, in particular, during operation, which radiation can be characterized for instance by a spectrum in a wavelength range having a spectral width of less than 10 nm and preferably less than 5 nm. Furthermore, the coherent electromagnetic radiation can have a coherence length of an order of magnitude of meters up to an order of magnitude of hundred meters or more. In this case, each active region can emit its own radiation beam of coherent electromagnetic radiation. The radiation beams can in each case have beam properties similar or identical to an ideal, Gaussian radiation beam.

The semiconductor layer sequence having at least two active regions can be suitable for increasing the power or the intensity of the electromagnetic radiation emitted by the laser light source in comparison with a laser light source having only one active region. In particular, the laser light source can be embodied as a so-called laser bar having a plurality of active regions.

The radiation beams of coherent electromagnetic radiation respectively emitted by the active regions can furthermore be collimatable and/or focusable in a radiation beam. For this purpose, it is possible to dispose downstream of the radiation coupling-out area of the semiconductor layer sequence, and in particular downstream of the active regions, a collimation or focusing optical unit such as, for instance, one or more anamorphic lenses, for instance one or more cylindrical lenses, by means of which the electromagnetic radiation can be collimated and/or focused to form a radiation beam.

In order to generate coherent electromagnetic radiation by means of stimulated emission, the radiation coupling-out area and/or that side area of the semiconductor layer sequence which lies opposite the radiation coupling-out area, and which can also be referred to as the rear side, can be embodied as at least partly reflective. As a result, the radiation coupling-out area and the rear side can form an optical resonator for the electromagnetic radiation generated in the active regions. In this case, it can be possible that one or more standing electromagnetic waves corresponding to one or more of the modes predefined by the optical resonator in the active regions form in each of the at least two active regions. In particular, the modes that form in the at least two active regions can differ for instance in terms of their relative phase angle with respect to one another.

The radiation coupling-out area and the rear side of the semiconductor layer sequence can be producible for example by cleavage of the semiconductor layer sequence along a crystal plane. Furthermore, the radiation coupling-out area and/or the rear side of the semiconductor layer sequence can have a reflective coating, for instance in the form of Bragg mirrors.

Since the active regions are arranged in the same active layer, it can be possible in known laser bars having a plurality of active regions that so-called optical crosstalk can take place between the active regions. Said optical crosstalk can be brought about, in principle, by the coherent electromagnetic radiation which is generated by one active region and which can be backscattered into the same active region or scattered or directed into another active region. Furthermore, it can also be possible that besides the stimulated emission which can preferably lead to the generation of the coherent electromagnetic radiation in the active regions, incoherent electromagnetic radiation can be generated and emitted isotropically as a result of spontaneous emission that additionally takes place. Therefore, incoherent electromagnetic radiation generated in this way can be radiated from one active region into another active region. Such electromagnetic radiation which propagates within the semiconductor layer sequence and can be radiated into an active region is referred to hereinafter as stray radiation. The stray radiation can disturb the formation of standing waves, that is to say of electromagnetic field modes, in the active regions, which can result in a reduction of the power or intensity respectively emitted by the active regions and also a reduction of the beam quality.

By virtue of the fact that the laser light source described here comprises a surface structure having at least one first depression and second depressions, the stray radiation is prevented from propagating in the semiconductor layer sequence. Furthermore, the optical crosstalk can thereby be reduced or prevented. The beam quality of the electromagnetic radiation emitted by the active regions of the laser light source, for example measurable in the form of the beam quality factor $M^2$ known to the person skilled in the art, can thus be significantly improved in comparison with conventional laser bars.

The semiconductor layer sequence can be embodied as an epitaxial layer sequence or as a radiation-emitting semiconductor chip comprising an epitaxial layer sequence, that is to say as a semiconductor layer sequence grown epitaxially. In this case, the semiconductor layer sequence can be embodied on the basis of AlGaAs, for example. AlGaAs-based semiconductor chips and semiconductor layer sequences include, in particular, those in which the semiconductor layer sequence produced epitaxially generally has a layer sequence composed of different individual layers containing at least one individual layer which comprises a material from the III-V compound semiconductor material system $Al_xGa_{1-x}As$ where $0 \leq x \leq 1$. In particular, an active layer comprising an AlGaAs-based material can be suitable for emitting electromagnetic radiation having one or more spectral components in a red to infrared wavelength range. Furthermore, a material of this type can comprise In and/or P in addition or as an alternative to the elements mentioned.

Furthermore, the semiconductor layer sequence can be embodied on the basis of InGaAlN, for example. InGaAlN-based semiconductor chips and semiconductor layer sequences include, in particular, those in which the semiconductor layer sequence produced epitaxially generally has a layer sequence composed of different individual layers containing at least one individual layer which comprises a material from the III-V compound semiconductor material system $In_xAl_yGa_{1-x-y}N$ where $0 \leq x \leq 1$, $0 \leq y \leq 1$ and $x+y \leq 1$. Semiconductor layer sequences having at least one active layer on the basis of InGaAlN can, for example, preferably emit electromagnetic radiation in an ultraviolet to green wavelength range.

As an alternative or in addition, the semiconductor layer sequence or the semiconductor chip can also be based on InGaAlP, that is to say that the semiconductor layer sequence can have different individual layers, at least one individual layer of which comprises a material from the III-V compound semiconductor material system $In_xAl_yGa_{1-x-y}P$ where $0 \leq x \leq 1$, $0 \leq y \leq 1$ and $x+y \leq 1$. Semiconductor layer sequences or semiconductor chips which have at least one active layer on the basis of InGaAlP can, for example, preferably emit electromagnetic radiation having one or more spectral components in a green to red wavelength range.

As an alternative or in addition, the semiconductor layer sequence or the semiconductor chip can also comprise II-VI compound semiconductor material systems besides or instead of the III-V compound semiconductor material systems.

The semiconductor layer sequence can furthermore have a substrate on which the abovementioned III-V or II-VI compound semiconductor material systems are deposited. In this case, the substrate can comprise a semiconductor material, for example a compound semiconductor material system mentioned above. In particular, the substrate can comprise GaP, GaN, SiC, Si and/or Ge or be composed of such a material.

The semiconductor layer sequence can have, as active regions in the active layer, for example, conventional pn junctions, double heterostructures, single quantum well structures (SQW structures) or multiple quantum well structures (MQW structures). The semiconductor layer sequence can comprise, besides the active layer having the active regions, further functional layers and functional regions, for instance p- or n-doped charge carrier transport layers, that is to say electron or hole transport layers, p- or n-doped confinement, cladding or waveguide layers, barrier layers, planarization layers, buffer layers, protective layers and/or electrodes and combinations thereof. In this case, the electrodes can each have one or more metal layers comprising Ag, Au, Sn, Ti, Pt, Pd and/or Ni. Such structures concerning the active layer or the further functional layers and regions are known to the person skilled in the art in particular with regard to construction, function and structure and, therefore, will not be explained in any greater detail at this juncture.

Furthermore, additional layers, for instance buffer layers, barrier layers and/or protective layers, can also be arranged around the semiconductor layer sequence, for example, perpendicularly to the growth direction of the semiconductor layer sequence, that is to say, for instance, on the side areas of the semiconductor layer sequence.

Furthermore, the semiconductor layer sequence can be embodied as a so-called "distributed feedback laser", DFB laser for short. DFB lasers of this type have active regions which are periodically structured in the emission direction. A periodically structured active region has periodically arranged regions having alternating refractive indices which can form an interference grating or interference filter which can lead to wavelength-selective reflection.

By virtue of a side area of the semiconductor layer sequence being embodied as a radiation coupling-out area, the semiconductor layer sequence can preferably be an edge emitting laser diode. Preferably, the semiconductor layer sequence can in this case have a first and a second waveguide layer between which the active layer with the active regions is arranged and which enable guidance of the electromagnetic radiation generated in the active regions in the active layer.

The main surface with the electrical contact areas and the surface structure can have a main extension plane, which can be perpendicular to the growth direction of the semiconductor layer sequence. In particular, the main surface with the electrical contact areas and the surface structure can be a surface of the semiconductor layer sequence which lies opposite a substrate.

The electrical contact areas on the main surface can be embodied, in particular, as such area regions of the main surface which are electrically conductively connected to an electrode applied on the main surface. For this purpose, by way of example, an electrode layer, which can comprise one of the abovementioned metals, for instance, can be applied in a structured fashion in the form of the electrical contact areas on the main surface.

As an alternative or in addition, an electrically insulating layer can be applied on the main surface in a structured fashion in such a way that the electrical contact areas are free of the electrically insulating layer and an electrode layer is applied in a structured fashion or in a large-area fashion above the electrically insulating layer and the electrical contact areas on the main surface. As an alternative or in addition, the semiconductor layer sequence can have, in a structured fashion in the regions of the electrical contact areas, a layer comprising a highly doped semiconductor material which enables an ohmic electrical contact with an electrode, this ohmic electrical contact having a low contact resistance in comparison with the rest of the main surface.

By virtue of the form of the electrical contact areas and the electrical conductivities of the functional layers in the growth direction and also in the extension plane of the semiconductor layer sequence, the active regions can form below the active contact areas in the active layer, in which active regions the current density is high enough to enable stimulated emission of coherent electromagnetic radiation. In a manner corresponding to the first and second partial regions of the electrical contact areas, the active regions can have precisely such first and second partial regions. The mode structure of the standing electromagnetic waves generated in the active regions can thus be influenced by the form of the electrical contact areas. The emission direction of the semiconductor layer sequence can correspond to the main extension direction of the electrical contact areas and thus the main extension direction of the active regions.

In this case, it can be advantageous if the first partial region of an electrical contact area extends along the emission direction with a constant width on the main surface. In particular, the first partial regions of the at least two electrical contact areas can in this case be embodied as strips arranged parallel to one another. The first partial regions of the electrical contact areas can furthermore adjoin the rear side of the semiconductor layer sequence lying opposite the radiation coupling-out area. In this case, the width of the first partial regions can be less than or equal to 20 μm, preferably less than or equal to 10 μm, and particularly preferably less than or equal to 5 μm.

The first partial region of an electrical contact area can furthermore directly adjoin the second partial region. That can mean that the second partial region, in a boundary region in which the second partial region adjoins the first partial region, has the same width as the first partial region. In particular, the second partial region can in this case widen linearly away from the first partial region in the emission direction. That can mean, in particular, that the second partial region has a trapezoidal form, which can furthermore be symmetrical with respect to the emission direction. In this case, the second partial region can widen in the emission direction to a width of greater than or equal to 50 μm, greater than or equal to 100 μm, or greater than or equal to 200 μm. In particular, the aperture angle at which the second partial region widens can be greater than or equal to 1° and less than or equal to 10°, and in particular greater than or equal to 2° and less than or equal to 6°, which results from the Gaussian formalism of diffraction-limited beams. The guidance of the electromagnetic radiation in the second partial region can in this case be effected according to the principle of gain guidance, which means that an at least virtually Gaussian beam is generated in the first partial region, for which beam large diffraction angles can be possible on account of the small width of the first partial region. Furthermore, the virtually Gaussian beam can diffract from the first partial region freely into the second partial region and effectively gain in power during propagation along the second partial region. In this case, the second partial region can adjoin the radiation coupling-out area via which electromagnetic radiation that is generated in the active region and amplified can be emitted directly.

In this case, it can be advantageous if layers of the semiconductor layer sequence are structured in ridge-type fashion in such a way that the main surface with the electrical contact areas comprises the ridge-type structures. In particular, such a configuration of the main surface of the semiconductor layer sequence, which configuration is also known as a "ridge structure" or ridge waveguide structure, can be suitable for making possible, depending on its width and height and as a result of the so-called index guidance brought about on account of the ridge-type structure and associated jump in refractive index of from approximately 0.005 to 0.01, the formation of a transverse fundamental mode in the active region. In this case, the height of a ridge structure can influence said jump in refractive index to a greater extent than the width. The width and height of the ridge structure can furthermore also determine the aperture angle of the virtually Gaussian beam from the first partial region upon entering into the second partial region of an active region. In particular, the main surface has such ridge-type structures or ridge structures on which the first and the second partial regions of the electrical contact areas are in each case arranged.

In this case, by way of example, the ridge structure can be structured as far as a first depth in the first partial region and as far as a second depth in the second partial region, wherein the first and second depths can be identical or different. In particular by way of example, the first depth for index guidance can extend as far as a waveguide layer, while the second depth for gain guidance described above can extend as far as a semiconductor contact layer or cladding layer arranged above the waveguide layer. Furthermore, the first depth can also extend right into the cladding layer, while the second depth can extend as far as an interface between the cladding layer and a semiconductor contact layer arranged thereabove or even only into the semiconductor contact layer.

In order to produce the ridge structure it is possible, by way of example, to provide a semiconductor layer sequence having the functional layers mentioned above. The ridge structure can then be produced through a mask by means of a removing method, for instance etching, on the main surface of the semiconductor layer sequence. In this case, the width of the ridge structure in the first and second partial regions of the subsequent electrical contact area can be settable by means of a mask which can be produced photolithographically. In order to obtain a defined and uniform height of the ridge structure, the semiconductor layer sequence can have a so-called etching stop layer. In the case of a semiconductor layer sequence comprising AlGaAs-based materials, for example, the etching stop layer can have an Al-free, P-containing layer in a layer or between two layers of the semiconductor layer sequence. In this case, by way of example, the etching stop layer can comprise an Al-free, P-containing GaAs semiconductor material and/or InGaP or be composed thereof. By way of example, the etching stop layer can be arranged in a waveguide layer arranged between the active layer and the main surface. In this case, the thickness, doping and/or position of the etching stop layer in the waveguide layer can be adapted to the waveguide layer. In this case, after etching, the etching stop layer can adjoin the ridge structure and form a part of the main surface.

In order to avoid the above-described optical crosstalk between the active regions, the first depression can project from the main surface into the semiconductor layer sequence to an extent such that propagation of the stray radiation in the semiconductor layer sequence can be reduced or prevented. In this case, the first depression can extend into one of the functional layers of the semiconductor layer sequence. The fact that the first depression "extends into a layer" can mean that the first depression ends in the layer and the layer has a smaller thickness in the region of the first depression than alongside the first depression. It can furthermore mean that the first depression penetrates right through the layer and therefore extends as far as an interface with a further layer arranged below the layer. By way of example, the semiconductor layer sequence can have two waveguide layers, between which the active layer is arranged. The first depression can extend at least into the waveguide layer between the active layer and the main surface. Furthermore, the first depression can extend right into the active layer or right into the waveguide layer arranged below the active layer, as viewed from the main surface. Furthermore, the first depression can extend right into a layer below the waveguide layers and the active layer, for instance a cladding or intermediate layer, or as far as a substrate on which the functional layers are applied.

Furthermore, the first depression can extend on the main surface from the radiation coupling-out area as far as the rear side of the semiconductor layer sequence lying opposite the radiation coupling-out area. In this case, by way of example, the first depression can comprise at least one trench which extends parallel to the active regions along the emission direction. As an alternative or in addition, the first depression can also have a plurality of trenches or depressions arranged alongside one another and/or one behind another.

The first depression can have sidewalls which can extend along the growth direction of the semiconductor layer sequence and form an angle of greater than or equal to 90° with the main surface. In this case, an angle of 90° can mean that the first depression has sidewalls which are embodied parallel to the growth direction of the semiconductor layer sequence and thus perpendicularly to the main surface. An angle of greater than 90° means that the edge between a sidewall of the first depression and the main surface forms an obtuse angle. Consequently, the cross section of the first depression decreases in a direction as viewed from the main surface into the semiconductor layer sequence. In this case, the first depression can have a V-shaped or U-shaped cross section or a combination thereof. In particular, the first depression can have sidewalls which form an edge having an angle of less than or equal to 135°, and preferably equal to 135°, with the main surface. As a result, stray radiation which propagates in the semiconductor layer sequence and impinges on the sidewall of the first depression can be reflected downward, as viewed from the main surface, into functional layers lying below the active layer and/or a substrate and be absorbed therein. For this purpose, the semiconductor layer sequence can for example additionally have a layer comprising an absorbent material below the active layer.

Furthermore, the first depression can be at least partly filled with an absorbent material. That can mean that at least the sidewalls of the first depression can be coated with an absorbent material. Stray radiation which propagates in the semiconductor layer sequence and impinges on the first depression can therefore be absorbed and prevented from further propagation in the semiconductor layer sequence.

The absorbent material can comprise, for example, gallium, aluminum, chromium or titanium or a combination thereof. Furthermore, the absorbent material can comprise a semiconductor material, for instance silicon, germanium, InAlGaAs, InGaAlP and InGaAlN, ZnSe and/or ZnS. The semiconductor material can preferably have a band gap which is less than or equal to the wavelength of the electromagnetic radiation generated in the active regions. Furthermore, the absorbent material can comprise antimony or a layer or a layer stack comprising antimony with one or more of the materials N, Te, Ge, Ag and In, for example antimony nitride ($SbN_x$), SbTe, GeSbTe and/or AgInSbTe. As an alternative or in addition, the first filter element can also have a layer or a layer stack comprising $AgO_x$, $PtO_x$ and/or $PdO_x$. Such layers or layer stacks are also known as "super-resolution near-field structure" (super-RENS), which, below a limit temperature, can be non-transparent and absorbent to electromagnetic radiation.

By virtue of the first depression described here, the at least two active regions can thus be effectively optically isolated, such that optical crosstalk between the active regions can no longer take place.

Furthermore, at least one second depression of the second depressions, as described in connection with the first depression, can extend into a layer of the semiconductor layer sequence, for instance into a waveguide layer, into the active layer or into the substrate. Furthermore, at least one second depression can have sidewalls which can form an angle of greater than or equal to 90° and less than or equal to 135° with the main surface and can therefore form a right-angled or obtuse-angled edge with the main surface. In particular, the second depressions can be embodied in an identical fashion with regard to their depth, size and cross-sectional form.

At least one second depression can have an extension direction which can form an angle of greater than 0° and less than 90° with the emission direction. Preferably, the angle can be greater than or equal to 30° and less than or equal to 60°, and particularly preferably approximately 45°. That can mean that the at least one second depression comprises a trench or is embodied as a trench and is arranged obliquely with respect to the emission direction.

In particular, that can also mean that the at least one second depression is also arranged obliquely with respect to the radiation coupling-out area. As a result, it can be possible that electromagnetic radiation which is reflected at the radiation coupling-out area and can propagate as stray radiation in the semiconductor layer sequence counter to the emission direction in a manner laterally offset with respect to the active region can be reflected by the second depression in the direction of the first depression and, as described above, can likewise be reflected or else absorbed by the latter. Laser oscillations possibly occurring alongside the active region can thereby be prevented, such that no secondary modes which could impair the beam quality of the electromagnetic radiation generated by the active region occur in the active layer.

Furthermore, at least one second depression, as described above in connection with the first depression, can be at least partly filled or coated with an absorbent material.

In particular, the second depressions can be embodied in an identical fashion, wherein in each case two second depressions can be arranged around a first partial region of an electrical contact area symmetrically with respect to the emission direction. In this case the second depressions can be at a distance of less than or equal to 4 μm from an active region and/or a ridge structure or electrical contact area. Precisely by virtue of the fact that the second depressions are arranged alongside the first partial regions of the electrical contact areas in such a way that the first partial regions are situated between in each case two second depressions, diaphragms in the semiconductor layer sequence can be made possible by means of the second depressions, said diaphragms having a smallest possible diaphragm aperture. In particular, it can be advantageous in this case if the second depressions are arranged closer to the second partial region than to the rear side of the semiconductor layer sequence.

In order to avoid, in particular, the arising of stray radiation as a result of reflection of coherent electromagnetic radiation generated in the active region at the radiation coupling-out area, the radiation coupling-out area can have a layer having a reflectivity of less than or equal to 10%, preferably less than or equal to 5%, and particularly preferably less than or equal to 2%, such that the radiation coupling-out area can have a transmission coefficient of greater than or equal to 90%, preferably greater than or equal to 95%, and particularly preferably greater than or equal to 98%. In particular, a reflection coefficient of 0.1 to 2% can be advantageous. By way of example, the layer can be embodied as an individual layer or as a layer sequence having layer pairs and in this case can comprise metal or semimetal oxides and/or metal or semimetal nitrides. A metal oxide or a semimetal oxide can comprise aluminum, silicon, titanium, zirconium, tantalum, niobium, or hafnium. Furthermore, a nitride can comprise at least one of said metals and semimetals, for example silicon nitride. Particularly preferably, the metal oxide or the semimetal oxide comprises at least one of the materials niobium pentoxide, hafnium dioxide, aluminum oxide, silicon dioxide, titanium dioxide, tantalum pentoxide and zirconium dioxide.

Furthermore, the semiconductor layer sequence can have a multiplicity of active regions with associated electrical contact areas on the main surface. That can mean, in particular, that the semiconductor layer sequence has at least one further active region and a further electrical contact area having a first and second partial region which are arranged transversely with respect to the emission direction alongside the at least two active regions and the associated electrical contact areas, respectively. Furthermore, the semiconductor layer sequence can have on the main surface at least one further first depression between the at least two electrical contact regions and the further electrical contact region. Furthermore, on the main surface, a further two second depressions can be arranged, between which the first partial region of the further electrical contact area is arranged.

The laser light source described here enables a high emission power with at the same time high beam quality. In comparison therewith, known broad stripe laser diodes, which can have an active region having a width of the order of magnitude of hundreds of μm, have admittedly a high emission power but associated therewith also an emission characteristic having a plurality of electromagnetic modes and also a greatly asymmetrical beam profile as a consequence of the asymmetrical beam parameter product with respect to the beam axes parallel to the extension plane of the semiconductor layers ("slow axis") and parallel to the growth direction of the semiconductor layer sequence ("fast axis"). As a result, a broad stripe laser usually requires, in contrast to the laser light source described here, a complex and expensive optical unit in order to symmetrize the emission characteristic. In contrast to known trapezoidal laser bar embodiments, the laser light source described here also enables a high beam quality with at the same time high power. In this case, the laser light source described here can be producible in a cost-effective manner.

BRIEF DESCRIPTION OF THE DRAWINGS

FIGS. 2A to 2C show schematic illustrations of a laser light source in accordance with a further exemplary embodiment.

DETAILED DESCRIPTION OF THE DRAWINGS

In the exemplary embodiments and figures, identical or identically acting constituent parts can be provided in each case with the same reference symbols. The illustrated elements and their size relationships among one another should not be regarded as true to scale, in principle; rather, individual elements such as, for example, layers, structural parts, components and regions may be illustrated with exaggerated thickness or size dimensions in order to enable better illustration and/or in order to afford a better understanding.

Figure 1A:
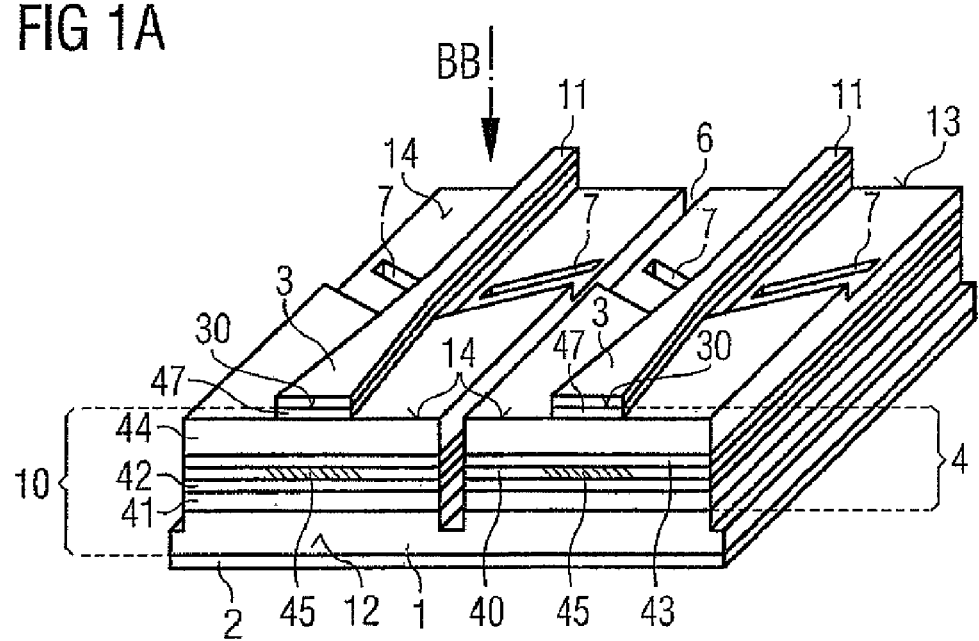
FIGS. 1A and 1B show schematic illustrations of a laser light source in accordance with one exemplary embodiment.
Figure 1B:
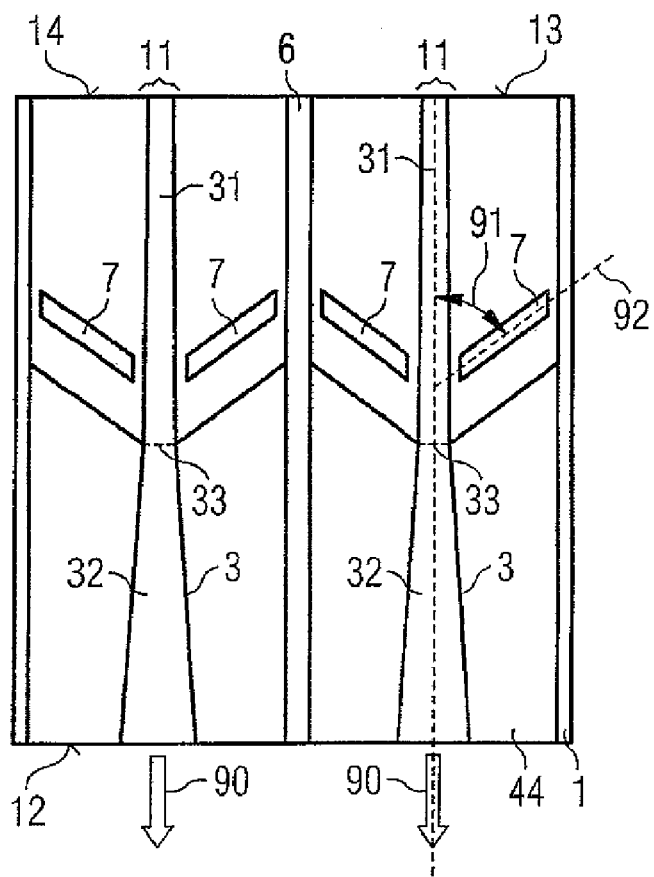

FIGS. 1A and 1B show an exemplary embodiment of a laser light source. Unless expressly indicated otherwise, the following description concerning this exemplary embodiment refers equally to both FIGS. 1A and 1B.

In this case, FIG. 1A shows a schematic three-dimensional illustration of the laser light source comprising a semiconductor layer sequence 10. FIG. 1B shows a plan view of the laser light source from the direction identified by BB in FIG. 1A.

The laser light source in accordance with the exemplary embodiment in FIGS. 1A and 1B has a semiconductor layer sequence 10 comprising a substrate 1, on which a plurality of functional, epitaxially grown layers 4 are applied. In this case, in the exemplary embodiment shown, the semiconductor layer sequence 10 is formed by a GaAs substrate 1 and thereabove a 100 nm thick intermediate or cladding layer 41 composed of AlGaAs having an Al proportion of approximately 40% of the group III materials and/or composed of InGaP having an In proportion of approximately 50% of the group III materials, and thereabove a 2 μm thick InAlP waveguide layer 42, thereabove a 100 nm thick InGaAlP/InGaP quantum film/barrier layer MWQ structure having an In proportion of approximately 50% and an Al proportion of approximately 25%, thereabove a 2 μm thick InAlP waveguide layer 43 and thereabove a 100 nm thick InGaP intermediate or cladding layer 44. In addition, a contact layer, for instance a 300 nm thick GaAs contact layer 47, is arranged on the cladding layer 44. A semiconductor layer sequence 10 of this type can be suitable for generating yellow to infrared electromagnetic radiation, and particularly preferably electromagnetic radiation in a red wavelength range.

As an alternative to the arsenide-based semiconductor materials described here, the semiconductor layer sequence 10 can also comprise nitride-based semiconductor materials, for example. A semiconductor layer sequence 10 of this type can be suitable for generating electromagnetic radiation in an ultraviolet to green and preferably in a blue wavelength range.

In this case, the substrate 1 can be a growth substrate on which the functional layers are grown epitaxially. As an alternative thereto, the semiconductor layer sequence can be producible using thin-film technology. That means that the functional layers are grown on a growth substrate and subsequently transferred to a carrier substrate, which then forms the substrate 1 of the semiconductor layer sequence 10. In this case, depending on the growth technique, the n-conducting layers or the p-conducting layers of the semiconductor layer sequence 10 can face the substrate 1.

Furthermore, the semiconductor layer sequence 10 has a radiation coupling-out area 12 and a surface 13 lying opposite the latter and embodied as a rear side, which in each case have an at least partly reflective coating (not shown). As a result, the radiation coupling-out area 12 and the rear side 13 form an optical resonator. The respective reflective coating can comprise, for example, a Bragg mirror layer sequence and/or reflective metal layers.

Furthermore, passivation layers for protecting the semiconductor layer sequence can be applied (not shown) on or above the surfaces of the semiconductor layer sequence which are different than the radiation coupling-out area.

The electrical contact-connection of the semiconductor layer sequence 10 is effected by means of an electrode 2 on that surface of the substrate 1 which is remote from the functional layers 4, and by means of electrode strips 3 on the main surface 14 of the functional layers 4 which lies opposite the substrate 1. In this case, the electrodes 2 and 3 can each have one or more metal layers comprising Ag, Au, Sn, Ti, Pt, Pd and/or Ni.

As an alternative to the electrical contact-connection by means of the electrode 2 through the substrate 1, the electrical contact 2 can also be arranged on the same side of the substrate 1 as the functional layers 4. This type of contact-connection is primarily suitable for making electrical contact with the functional layers 4 from the substrate side if said layers are arranged on an electrically non-conductive substrate 1.

The contact areas between the electrode strips 3 and the cladding layer 44 are embodied as electrical contact areas 30.

As indicated in FIG. 1B, the electrical contact areas 30 each have a first partial region 31 and a second partial region 32 adjoining the latter. The imaginary boundary line between the first and second partial regions is indicated in each case by the line 33. The second partial regions 32 have a width that increases along the emission direction 90 towards the radiation coupling-out area 12. In this case, the partial regions 32 are embodied in trapezoidal fashion and enable the power of the electromagnetic radiation generated in the active regions 45 to be amplified.

In the exemplary embodiment shown, the cladding layer 44 is embodied in ridge-type fashion in the region of the electrical contact areas 30 in the first partial region 31 and forms with the contact layer 47 a so-called ridge structure 11 as described in the general part, wherein the top sides of the ridge structures 11 as part of the main surface 14 form the electrical contact areas 30. In the second partial region 32, only the contact layer 47 is embodied in ridge-type fashion, such that the ridge structures have a larger depth in the first partial region 31 than in the second partial region. With regard to their form, the ridge structures 11 have the same form as the electrical contact areas 30.

By virtue of the ridge structures 11, the formation of coherent electromagnetic radiation in a transverse fundamental mode can be made possible in the active layer 40, whereas undesired further laser modes can be suppressed. As a result, the active layer 40 has active regions 45 below the electrical contact areas 30 and the ridge structures 11, which active regions are predefined, inter alia, by the dimensions of the electrical contact areas 30 and of the ridge structures 11 and are indicated by the hatched areas in the active layer 40 in the exemplary embodiment shown. In this case, the active regions 45 extend over the entire length of the active layer 40 in the resonator formed by the radiation coupling-out area 12 and the rear side 13. In the active regions 45, the semiconductor layer sequence 10 can generate coherent electromagnetic radiation by stimulated emission during operation, which radiation can be emitted as a radiation beam in each case via the radiation coupling-out area 12 along the emission direction better defined by 90.

Between the electrical contact areas 30, the main surface 14 has, as part of a surface structure, a first depression 6 extending over the main surface 14 along the emission direction 90. In this case, the first depression 6 is embodied as a trench that extends from the mains surface 14 right into the substrate 1. In this case, the first depression 6 in the exemplary embodiment shown has sidewalls which are perpendicular to the main surface 14 and respectively form right-angled edges with the main surface 14. In this case, the first depression 6 extends from the radiation coupling-out area 12 as far as the rear side 13 of the semiconductor layer sequence 10.

By virtue of the first depression 6, the direct propagation of stray radiation from one active region 45 to the other active region 45 in the semiconductor layer sequence is no longer possible, such that the two active regions 45 are optically decoupled. Furthermore, the first depression can have, at least at the sidewalls, a layer comprising an absorbent material (not shown), which layer can comprise germanium, for instance. In order to avoid an electrical short circuit of the functional layers 4, a dielectrical layer, for instance silicon oxide, can be arranged between the sidewalls of the first depression 6 and the layer comprising the absorbent material.

Furthermore, the surface structure on the main surface 14 comprises second depressions 7, wherein each of the first partial regions 31 of the electrical contact areas 30 is arranged between two second depressions 7. In this case, the second depressions 7 each have an extension direction 92 which forms an angle 91 of approximately 45° with the emission direction 90, as is indicated by way of example by way of a second depression 7. In each case two of the second depressions 7 here are arranged symmetrically about the emission direction 90 and a respective first partial region 31. Like the first depression 6, the second depressions 7 extend from the main surface 14 into the substrate 1.

Stray radiation which can propagate for example as a result of the reflection of electromagnetic radiation generated in the active regions 45 at the radiation coupling-out area 12 counter to the emission direction 90 in a manner laterally offset with respect to the active regions 45 in the semiconductor layer sequence 10 can be reflected at the second depressions 7 to the first depression 6 or to side areas of the semiconductor layer sequence 10. The formation of electromagnetic secondary modes between the radiation coupling-out area 12 and the rear side 13 can thereby be prevented. In addition, the second depressions 7, like the first depression 6, can be at least partly filled with an absorbent material.

In order to reduce stray radiation reflected at the radiation coupling-out area 12, it is possible to apply on the radiation coupling-out area 12 a reflection-reducing layer or layer sequence (not shown) having a reflection coefficient of less than 2%, particularly preferably less than 1%.

Figure 2C:
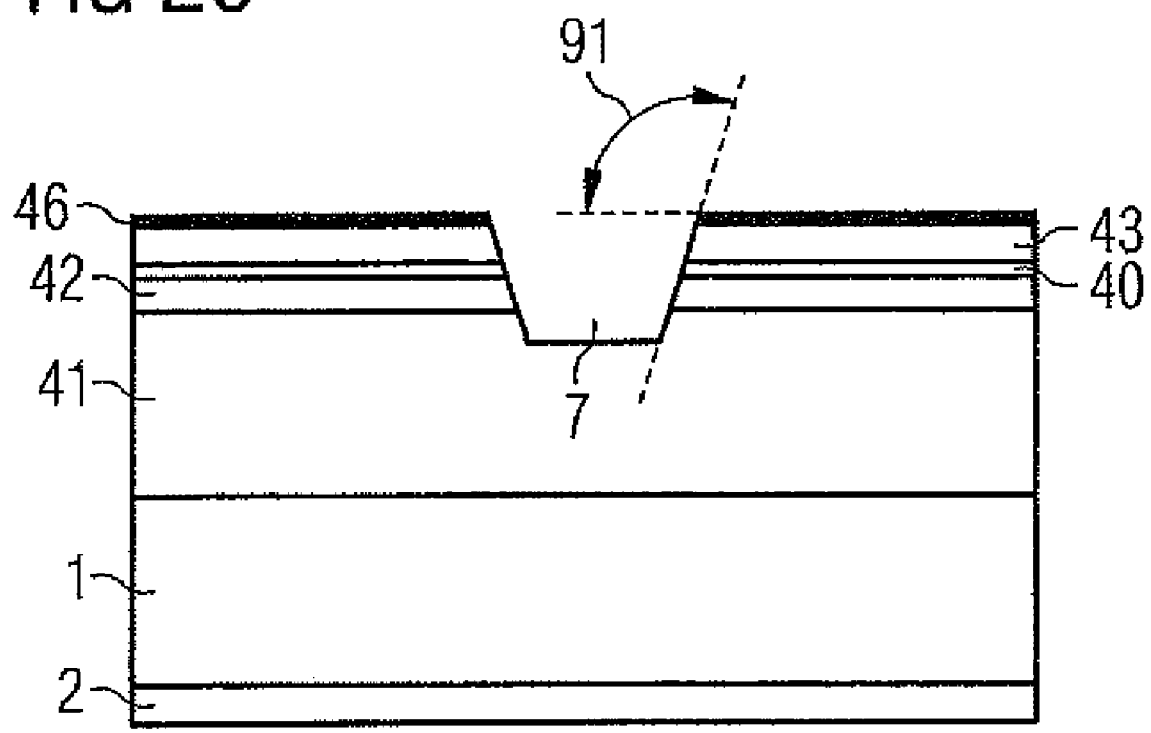

FIGS. 2A to 2C show a further exemplary embodiment of a laser light source, which constitutes a modification of the exemplary embodiment shown previously. Unless expressly indicated otherwise, the following description refers equally to all of FIGS. 2A to 2C. In this case, the differences and further developments in comparison with the previous exemplary embodiment are described, in particular.

In this case, FIG. 2A, like the previous FIG. 1B, shows a plan view of the laser light source. FIGS. 23 and 2C show sectional views through the laser light source along the sectional planes identified by BB and CC in FIG. 2A.

The laser light source in accordance with the exemplary embodiment in FIGS. 2A to 2C has a plurality of active regions and also a plurality of electrical contact areas 30. FIG. 2A shows the further electrical contact area 30' with respect to the two electrical contact areas 30 by way of example in this regard. The further electrical contact area 30' has a first partial region 31' and a second partial region 32', which are shaped like the first and second partial regions 31, 32 of the electrical contact areas 30.

A further first depression 6 is arranged between the electrical contact areas 30 and the further electrical contact area 30', said further first depression corresponding in terms of its configuration to the first depression 6 between the two electrical contact areas 34. The first partial region 31' of the further electrical contact area 30' is furthermore arranged between two further second depression 7', which are embodied like the second depressions 7.

As can be discerned from the sectional view BB in FIG. 2B, the first depressions 6, 6' have a V-shaped cross section. That means that the first depressions 6, 6' have sidewalls which form an angle 91 of greater than 90° with the main surface 14 and thus form an obtuse-angled edge with the main surface 14. As a result, it is possible that stray radiation through the first depressions 6, 6' which propagates in the semiconductor layer sequence 10 along the active layer 40, for example, can be reflected in the direction of the substrate 1. The substrate 1, the electrode 2 or an additional layer of the semiconductor layer sequence 10 (not shown) can be absorbent, for example, such that further propagation of the stray radiation can be prevented.

As can be discerned from the section view CC in FIG. 2C, the second depressions 7, 7' also have a V-shaped cross section. In this case, in the exemplary embodiment shown, the sidewalls of the second depressions 7, 7' form an angle of approximately 135° with the main surface 14, which corresponds to an inclination of approximately 45° with respect to the growth direction of the semiconductor layer sequence 10.

The semiconductor layer sequence 10 has besides that in connection with the previous exemplary embodiment in the waveguide layer 43, which is arranged between the active layer 40 and the main surface 14, an etching stop layer 46 composed of InGaP. By means of the etching stop layer 46, as described in the general part, a precisely defined height of the ridge structures 11 can be produced, as a result of which the beam quality of the electromagnetic radiation emitted by the active regions can be improved.

Arranged above the cladding layer 44 is a GaAs contact layer 47, which makes possible at the electrical contact areas 30 an ohmic contact with an electrode 3 applied in a large-area fashion, this ohmic contact having a low contact resistance. In order to enable current injection only via the electrical contact areas 30 and hence the formation of precisely defined active regions 45, a dielectric layer, for instance silicon dioxide, can be applied (not shown) on the entire mains surface 14 apart from the electrical contact areas 30.

The following FIGS. 3A to 5B show measurements with a laser light source in accordance with the exemplary embodiment in FIGS. 2A to 2C in comparison with a comparative laser light source, which show the advantageous method of operation of the surface structure having first and second depressions as described here.

Figure 3A:
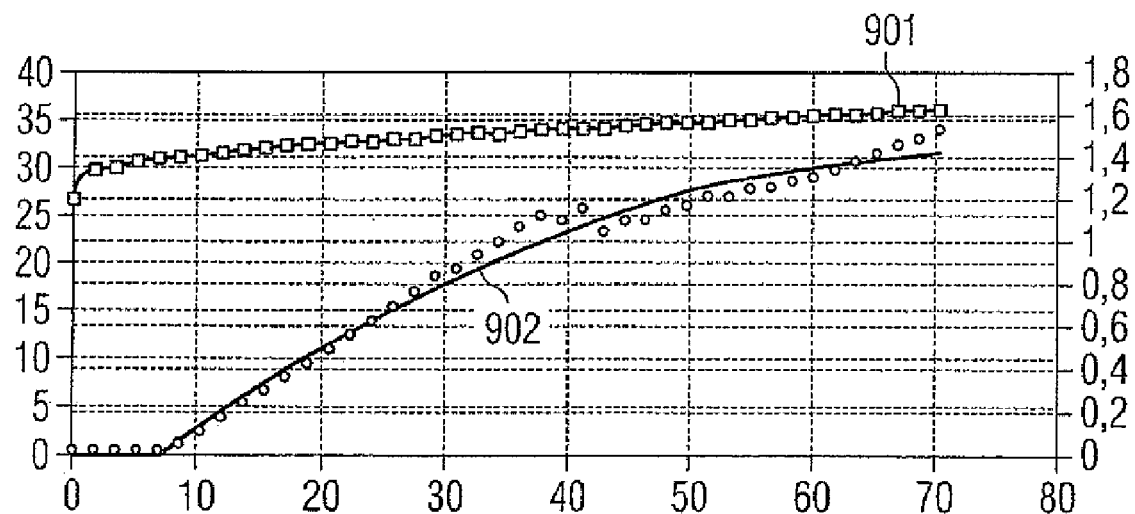
FIGS. 3A to 5B show measurements of laser light sources in accordance with further exemplary embodiments.
Figure 3B:
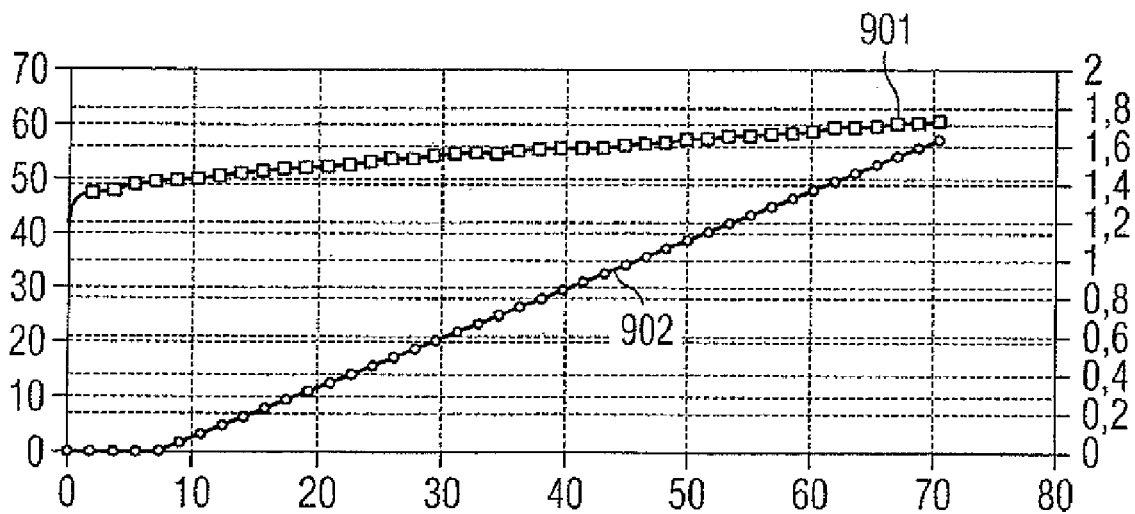

FIGS. 3A and 3B show power characteristic curves for a comparative laser light source (FIG. 3A) and a laser light source in accordance with an exemplary embodiment (FIG. 3B). In this case, the abscissa shows the current in amperes impressed on the comparative laser light source and the laser light source. The curves 901 (square symbols) show in conjunction with the right-hand ordinate the required voltage in volts, while the curves 902 (rhombic symbols), in each case in conjunction with the left-hand ordinate indicate the emitted power in watts.

In this case, the laser light source taken as a basis for the measurement in FIG. 3B is embodied as described in the previous exemplary embodiment and has a total width of 1 cm. The second partial regions have an aperture angle of 4°. The first partial regions have a width of 4 µm, which increases in the second partial regions to a width of 100 µm at the radiation coupling-out area 12. The radiation coupling-out area 12 is coated with a reflection-reducing layer having a reflectivity of 1%. The emitted electromagnetic radiation has a wavelength of 940 nm. The first depressions 6 have no absorbent material.

In contrast thereto, the comparative laser light source has no first depression 6 and hence no optical decoupling of the active regions 45. The second partial regions of the comparative laser light source have an aperture angle of 3°.

With regard to the emitted power, for the comparative laser light source, a saturation behavior and also steps brought about by feedback effects and optical crosstalk can clearly be discerned in the power characteristic curve 902. The maximum emitted power reaches approximately 34 W given a current of 70 A. In contrast thereto, the power characteristic curve 902 of the laser light source in accordance with the exemplary embodiment described here has a linear profile and a power of approximately 58 W given a current of 70 A.

Figure 4A:
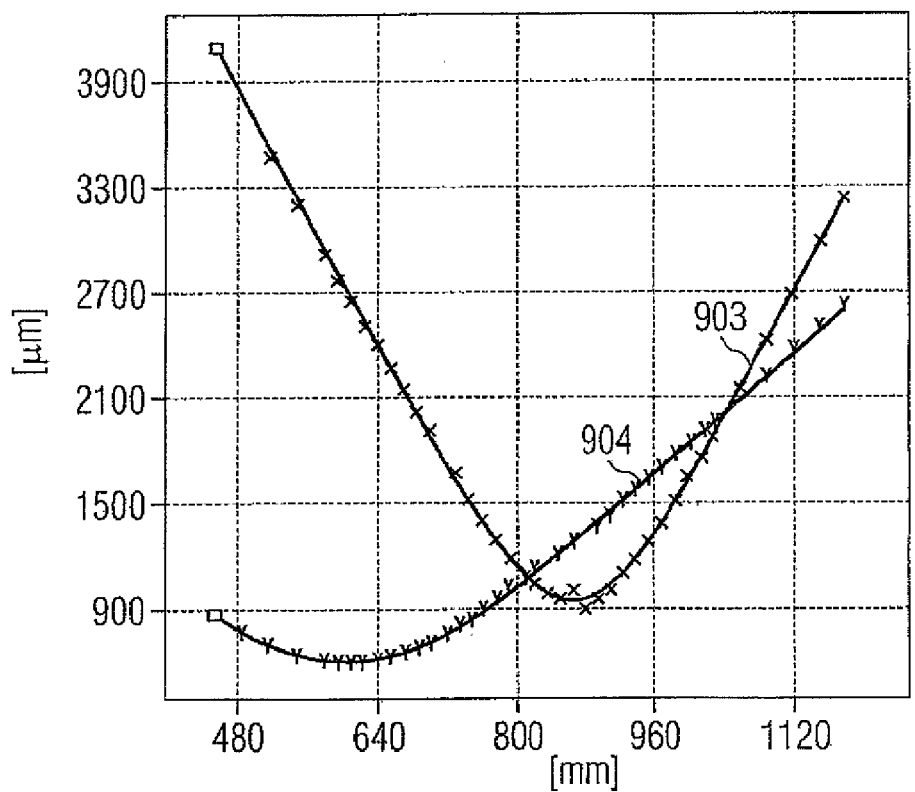
Figure 4B:
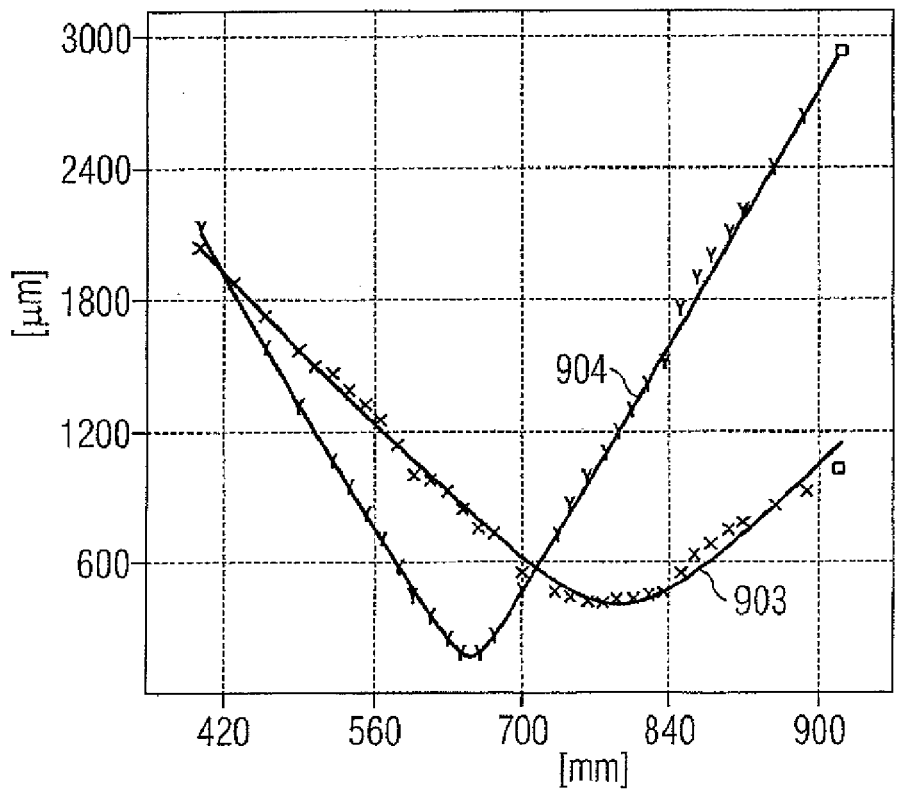

FIGS. 4A and 48 show beam caustic curves for a comparative laser light source (FIG. 4A) and a laser light source in accordance with an exemplary embodiment (FIG. 4B). Here the abscissas show in each case the distance from the radiation coupling-out area 12 in the emission direction 90 in millimeters, while the ordinates show in each case a distance from the beam center in micrometers. Here the curves 903 show lines equal to intensity in a beam center plane parallel to the extension plane of the semiconductor layer sequence 10 ("x-direction"), while the curves 904 show lines equal to intensity in a beam center plane perpendicularly thereto ("y-direction"). In this case, the measurements were carried out by means of a Spiricon beam propagation analyzer.

In contrast to the measurement in FIGS. 3A and 3B, the comparative laser light source in this measurement has neither first nor second depressions.

In particular, the curves 903 and 904 show the lateral position with respect to the beam center point in x- and y-directions at which a predefined intensity is attained. The beam quality factor $M^2$ known to the person skilled in the art can be determined from the gradient of the curves and also the respective minimum, which indicates the distance between the beam waist and the beam center point. For the comparative laser light source, $M^2$ in the x-direction is approximately 7, while $M^2$ for the laser light source in accordance with the exemplary embodiment in the x-direction is approximately 2.2.

Figure 5A:
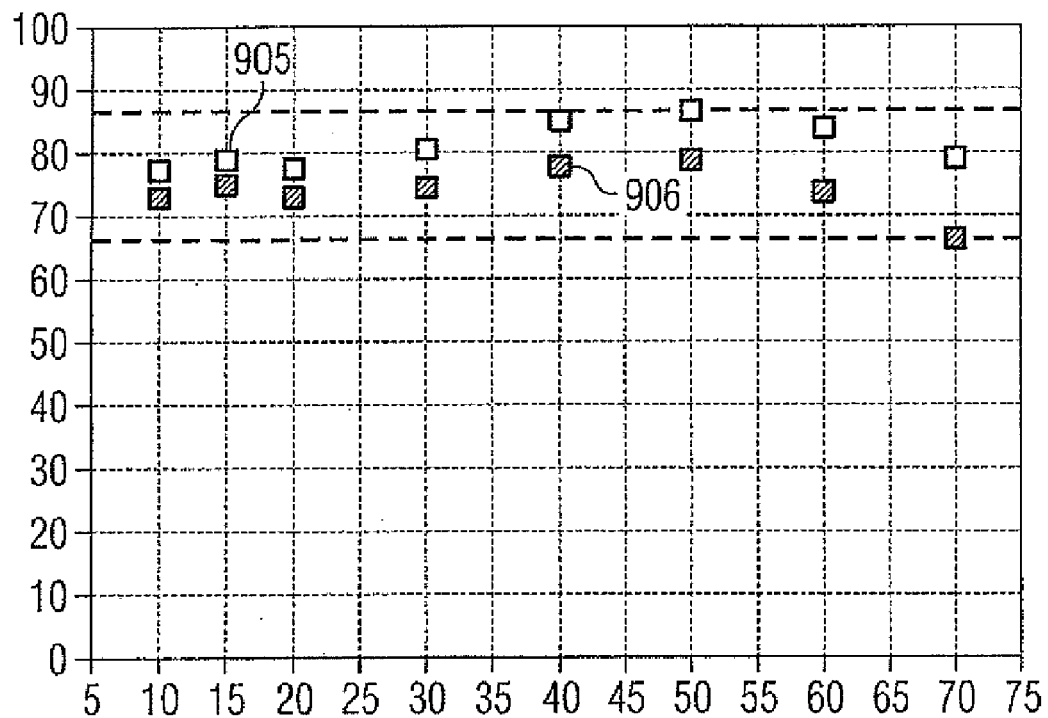
Figure 5B:
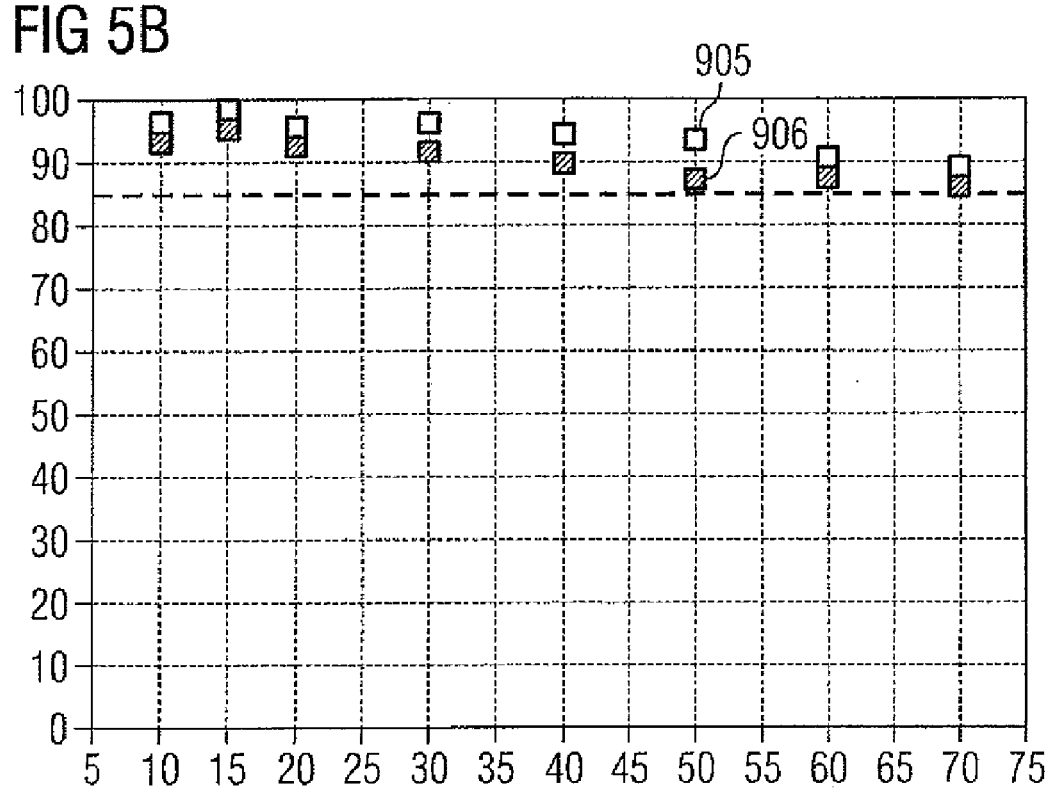

FIGS. 5A and 5B show coupling-in efficiencies for a comparative laser light source (FIG. 5A) and a laser light source in accordance with an exemplary embodiment (FIG. 5B). In the case of this measurement, the comparative laser light source once again has no first and second depressions. The abscissas show in each case the impressed current in amperes. The points 905 (open squares) show the coupling-in efficient (in %) of the electromagnetic radiation emitted by the comparative laser light source and laser light source into an optical fiber having a diameter of 600 µm and a numerical aperture (NA) of 0.2. The points 906 (filled squares) show the coupling-in efficiency (in %) of the electromagnetic radiation emitted by the comparative laser light source and laser light source into an optical fiber having a diameter of 400 µm and an NA of 0.2.

While the measurement in FIG. 5A for the comparative laser light source without first and second depressions given a current of 70 A reveals a coupling-in efficiency of approximately 79% for the 600 µm fiber and a coupling-in efficiency of approximately 66% for the 400 µm fiber, corresponding coupling-in efficiencies of 89% for the 600 µm fiber and 86% for the 400 µm fiber can be achieved with the laser light source in accordance with the exemplary embodiment. Losses at the lens surfaces of the coupling-in optical units are respectively taken into account here.

Furthermore, measurements were carried out in which comparative laser light sources having different aperture angles in the second partial regions were used. On average, with these comparative laser light sources, given a current of 70 A, a coupling-in efficiency of approximately 75% into a 400 µm fiber is achieved, which should be compared with the coupling-in efficiency 906 of 86% shown in FIG. 5B.

The measurements shown and described here clearly reveal that a high emission power with at the same time high beam quality can be made possible precisely by the combination of the first and second depressions.

Furthermore, a stacking of second or a plurality of the laser light sources shown is possible in order to achieve an increase in the emitted power. In this case, powers of approximately 1000 W per stack are possible in the case of coherent coupling, and powers of approximately 3000 W in the case of incoherent coupling.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A laser light source, comprising:
    a semiconductor layer sequence having an active layer having at least two active regions which are suitable for emitting electromagnetic radiation during operation via a side area of the semiconductor layer sequence along an emission direction, said side area being embodied as a radiation coupling-out area;
    a respective electrical contact area above each of the at least two active regions on a main surface of the semiconductor layer sequence; and
    a surface structure in the main surface of the semiconductor layer sequence, wherein
    the at least two active regions are arranged in a manner spaced apart from one another in the active layer transversely with respect to the emission direction,
    each of the electrical contact areas has a first partial region and a second partial region having a width that increases along the emission direction toward the radiation coupling-out area,
    the surface structure has, between the at least two electrical contact areas, at least one first depression along the emission direction and also second depressions,
    the first partial regions of the electrical contact areas are in each case arranged between at least two second depressions,
    the main surface comprises ridge-type structures with the electrical contact areas,
    each of the ridge-type structures has a first depth in the first partial region of the electrical contact areas and a second depth in the second partial region of the electrical contact areas, and
    the first depth is greater than the second depth.

2. The laser light source as claimed in claim 1, wherein the second partial regions in each case have a trapezoidal form and in each case adjoin the radiation coupling-out area.

3. The laser light source according to claim 1, wherein the first partial regions in each case extend with a constant width on the main surface along the emission direction.

4. The laser light source as claimed in claim 1, wherein the active layer is arranged between two waveguide layers on a substrate and the first depression extends from the main surface into at least one layer selected from the active layer, the waveguide layers and the substrate.

5. The laser light source as claimed in claim 1, wherein the first depression extends on the main surface from the radiation coupling-out area to a side area of the semiconductor layer sequence, said side area lying opposite the radiation coupling-out area.

6. The laser light source as claimed in claim 1, wherein the first depression has at least one trench parallel to the emission direction.

7. The laser light source as claimed in claim 1, wherein the first depression has sidewalls which form an angle of greater than or equal to 90° with the main surface.

8. The laser light source as claimed in claim 1, wherein an absorbent material is arranged in the first depression and/or in the second depression.

9. The laser light source as claimed in claim 1, wherein at least one second depression has an extension direction which forms an angle of greater than 0° and less than or equal to 90° with the emission direction.

10. The laser light source as claimed in claim 1, wherein at least one second depression is at a distance of less than or equal to 4 µm from an electrical contact area.

11. The laser light source as claimed in claim 1, wherein the active layer is arranged between two waveguide layers on a substrate and at least one second depression extends from the main surface right into at least one layer selected from the active layer, the waveguide layers and the substrate.

12. The laser light source as claimed in claim 1, wherein at least one second depression has sidewalls which form an angle of greater than or equal to 90° with the main surface.

13. The laser light source as claimed in claim 1, wherein the main surface comprises an etching stop layer, which adjoins the ridge-type structures.

14. The laser light source as claimed in claim 1, wherein
    the semiconductor layer sequence comprises, at a distance from the at least two active regions, at least one further active region in the active layer,
    the main surface has a further electrical contact area having a first and second partial region above the further active region,
    the surface structure has at least one further first depression along the emission direction, which is arranged between the at least two electrical contact areas and the further electrical contact area, and
    the surface structure has two further second depressions between which the first partial region of the further electrical contact area is arranged.

15. The laser light source as claimed in claim 1, wherein the first depth of the ridge-type structures extends to a waveguide layer of the semiconductor layer sequence and creates an index guidance, and the second depth of the ridge-type structures extends to a semiconductor contact layer or a cladding layer above the waveguide layer in the semiconductor layer sequence and creates a gain guidance.

* * * * *